United States Patent
Gurer et al.

[11] Patent Number: 6,027,760
[45] Date of Patent: Feb. 22, 2000

[54] PHOTORESIST COATING PROCESS CONTROL WITH SOLVENT VAPOR SENSOR

[76] Inventors: Emir Gurer, 709 Coast Range Dr., Scotvalley, Calif. 95066; Herbert Litvak, 790 Lodgewood Ct., San Jose, Calif. 95120; Richard Savage, 1034 Bellflower St., Livermore, Calif. 94550

[21] Appl. No.: 08/987,179

[22] Filed: Dec. 8, 1997

[51] Int. Cl.$^7$ ...................................................... B05D 3/12
[52] U.S. Cl. .............................. 427/8; 427/240; 427/335; 427/385.5; 118/52; 118/712; 118/713; 437/236
[58] Field of Search ................................. 427/8, 335, 240, 427/385.5; 437/231; 118/52, 712, 713

[56] References Cited

U.S. PATENT DOCUMENTS

| | | | |
|---|---|---|---|
| 4,312,228 | 1/1982 | Wolhtjen | 73/59 |
| 4,572,900 | 2/1986 | Wolhtjen | 436/151 |
| 4,584,867 | 4/1986 | Forster | 73/23 |
| 4,636,767 | 1/1987 | Barger et al. | 338/34 |
| 4,638,286 | 1/1987 | Nichols | 338/34 |
| 4,661,320 | 4/1987 | Ito et al. | 422/86 |
| 4,812,221 | 3/1989 | Madou et al. | 204/412 |
| 4,836,012 | 6/1989 | Doty et al. | 73/23 |
| 4,874,500 | 10/1989 | Madou et al. | 204/412 |
| 4,875,357 | 10/1989 | Giallorenzi | 73/27 |
| 4,887,455 | 12/1989 | Payne et al. | 73/27 |
| 4,900,405 | 2/1990 | Otagawa et al. | 73/599 |
| 4,932,255 | 6/1990 | Brace et al. | 73/204 |
| 5,030,009 | 7/1991 | Ando et al. | 356/417 |
| 5,189,914 | 3/1993 | White et al. | 73/599 |
| 5,200,633 | 4/1993 | Dickert et al. | 257/253 |
| 5,221,871 | 6/1993 | Fuchs et al. | 310/313 |
| 5,298,783 | 3/1994 | Wu | 257/414 |
| 5,372,785 | 12/1994 | Johnson et al. | 422/90 |
| 5,394,735 | 3/1995 | Fang et al. | 73/31.06 |
| 5,417,100 | 5/1995 | Miller et al. | 73/31.02 |
| 5,436,167 | 7/1995 | Robillard | 436/165 |
| 5,448,906 | 9/1995 | Cheung | 73/31.06 |
| 5,571,560 | 11/1996 | Lin | 427/240 |
| 5,627,323 | 5/1997 | Stern | 73/861.28 |

*Primary Examiner*—Janyce Bell

[57] ABSTRACT

An apparatus for spin coating surfaces with liquid polymer comprises a spin coating chamber having a rotatable chuck for supporting an object to be coated. A distributor introduces gases into the chamber. A solvent vapor and carrier gas supply provides a carrier gas having a controlled level of solvent vapor therein within the range of from 0 to saturation concentrations of solvent vapor. A solvent vapor sensor is positioned with respect to the coating chamber to produce signals which correspond to the concentration of solvent vapor in the coating chamber. A control means is connected to the solvent vapor concentration sensor and to the solvent vapor and carrier gas supply means for controlling the level of solvent concentration in the carrier gas supplied by the solvent vapor and carrier gas supply means. The solvent vapor level can be obtained by controlled mixing of solvent-bearing and solvent-free gas streams, or by injection of solvent into a gas stream by means of an atomizer, for example. The solvent vapor concentration sensor includes a component positioned for exposure to solvent vapor and which has a property which changes as a function of the solvent vapor concentration to which it is exposed. A preferred sensor can include a membrane, the vibrational frequency of which changes as a function of the solvent vapor concentration to which it is exposed; a surface, an electrical property of which changes as a function of the solvent vapor concentration to which it is exposed; a sensor which detects an acoustical property which changes as a function of the solvent vapor concentration to which it is exposed; or an optical detector which detects an optical property which changes as a function of the solvent vapor concentration to which it is exposed.

25 Claims, 3 Drawing Sheets

PHOTORESIST COATING PROCESS CONTROL WITH SOLVENT VAPOR SENSOR

FIELD OF THE INVENTION

This invention relates to coating semiconductor substrates with organic photoresist polymers. In particular, this invention relates to an improved apparatus and process for coating semiconductor substrates with solutions of organic polymers in the presence of volatile solvents, with improved control of volatile solvent emissions from the coating.

BACKGROUND OF THE INVENTION

The manufacture of integrated circuits involves the transfer of geometric shapes on a mask to the surface of a semiconductor wafer. Thereafter, the semiconductor wafer corresponding to the geometric shapes, or corresponding to the areas between the geometric shapes, is etched away. The transfer of the shapes from the mask to the semiconductor wafer typically involves a lithographic process. This includes applying a solution of a pre-polymer solution to the semiconductor wafer, the pre-polymer being selected to form a radiation-sensitive polymer which reacts when exposed to ultraviolet light, electron beams, x-rays, or ion beams, for example. The solvent in the pre-polymer solution is removed by evaporation, and the resulting polymer film is then baked. The film is exposed to radiation, for example, ultraviolet light, through a photomask supporting the desired geometric patterns. The images in the photosensitive material are then developed by soaking the wafer in a developing solution. The exposed or unexposed areas are removed in the developing process, depending on the nature of the radiation-sensitive material. Thereafter, the wafer is placed in an etching environment which etches away the areas not protected by the radiation-sensitive material. Due to their resistance to the etching process, the radiation sensitive-materials are also known as photoresists, and the term photoresist is used hereinafter to denote the radiation-sensitive polymers and their pre-polymers.

The high cost of the photoresist pre-polymer solutions makes it desirable to devise methods of improving the efficiency of the coating process so as to minimize the amount of the polymer solution required to coat a substrate. Furthermore, thickness uniformity of the photoresist layer is an important criterion in the manufacture of integrated circuits. When the radiation is focused through the mask onto the coating, variations in thickness of the coating prevent the precise focus over the entire surface of the wafer which is required to obtain the sharpness necessary to ensure satisfactory reproduction of the geometric patterns on the semiconductor wafer for advanced circuits with line width dimensions approaching 0.25 micron line widths and smaller over a surface.

The solvent in the photoresist tends to evaporate during application, increasing the viscosity of the polymer solution and inhibiting the leveling of the resulting film. This produces thickness non-uniformities. It is therefore desirable to be able to control the rate of evaporation of solvent from the polymer solution during the coating process.

OBJECTS AND SUMMARY OF THE INVENTION

One object of this invention is to provide an improved wafer coating process which yields a greater coating uniformity across the entire surface of each wafer and from wafer-to-wafer.

Another object of this invention is to provide more accurate control of the solvent vapor concentration above the surface of a wafer during the coating and solvent removal phases of the coating process.

It is a still further object of this invention to provide a system for constant monitoring of the vapor concentration above the surface of a wafer, and a feedback control system to change the solvent vapor concentration provided over the surface of the wafer to maintain a predetermined solvent vapor concentration at each moment during the coating and solvent removal phases of the process.

In summary, an apparatus of this invention for spin coating surfaces with liquid polymer comprises a spin coating chamber having a rotatable chuck for supporting an object to be coated. A distributor communicates with the coating chamber and is positioned to introduce gases into the chamber. A solvent vapor and carrier gas supply control means communicates with the distributor. The solvent vapor and carrier gas supply provides a carrier gas having a controlled level of solvent vapor therein within the range of from 0 to saturation concentrations of solvent vapor. A solvent vapor sensor is positioned within the coating chamber to produce signals which are a function of the concentration of solvent vapor in the coating chamber. The control means is connected to the solvent vapor concentration sensor and to the solvent vapor and carrier gas supply means for controlling the level of solvent vapor in the carrier gas supplied by the solvent vapor and carrier gas supply means.

The apparatus includes a coating zone adjacent the rotatable chuck corresponding to the surface to be coated, and the solvent vapor sensor is positioned between the distributor and the coating zone.

The solvent vapor and carrier gas supply means can comprise a solvent vapor supply conduit communicating with the distributor, a carrier gas supply conduit communicating with the distributor, and control valve means positioned with respect to the solvent vapor supply conduit and the carrier gas supply conduit for the purpose of controlling the proportion of gases from the conduits which are supplied to the distributor. Alternatively, the solvent vapor and carrier gas supply means can include a gas supply manifold communicating with the distributor and with the solvent vapor supply conduit and the carrier gas supply conduit, wherein the control valve means is positioned with respect to the manifold, the solvent vapor supply conduit and the carrier gas supply conduit for controlling the proportion of gases from the conduits which are supplied to the distributor.

The manifold can have an inlet, the solvent vapor supply conduit and carrier gas supply conduit can have outlets, and the control valve means can be a valve positioned to simultaneously control flow from each of the outlets. Alternatively, the solvent vapor supply conduit and the carrier gas supply conduit can each have control valves which are positioned to control flow from the conduits to the distributor.

In another embodiment, the solvent vapor and carrier gas supply means includes a distributor manifold, a carrier gas supply conduit communicates with the manifold, and a solvent atomizer with a solvent atomizer pump communicates with the manifold. The control means is connected to the solvent vapor concentration sensor and to the solvent atomizer pump to control the amount of solvent to be atomized by the atomizer into the manifold.

Alternatively, the solvent vapor and carrier gas supply means includes a carrier gas supply conduit communicating with the distributor, and a solvent atomizer with a solvent atomizer pump communicating with the carrier gas conduit. The control means is connected to the solvent vapor concentration sensor and to the solvent atomizer pump for controlling the amount of solvent to be atomized by the atomizer into the carrier gas supply conduit.

The solvent vapor concentration sensor can include a component positioned for exposure to solvent vapor and which has a property which changes as a function of the solvent vapor concentration to which it is exposed. The sensor can include a membrane, the vibrational frequency of which changes as a function of the solvent vapor concentration to which it is exposed; it can include a surface, the electrical properties of which change as a function of the solvent vapor concentration to which it is exposed; or it can detect an acoustical property which is a function of the solvent vapor concentration. The sensor can include an optical detector optically exposed to the solvent vapor, the optical detector sensing an optical property of the solvent which is a function of the solvent vapor concentration. The optical detector can include a spectrophotometer which measures a spectral property of the solvent vapor, such as polarization shift properties, which changes as a function of the solvent vapor concentration.

The method of this invention for spin coating a surface with a polymer in a volatile solvent environment, the coating being applied in the presence of a stream of carrier gas having a controlled concentration of volatile solvent therein, comprises applying the polymer to a surface to be coated in a coating chamber, passing a carrier gas through the coating chamber, the carrier gas having a concentration of volatile solvent for the liquid polymer therein, generating a signal which is a function of the concentration of volatile solvent in the carrier gas by means of a solvent vapor concentration sensor positioned near the surface being coated with the polymer, while carrier gas passes through the chamber, and adding an amount of volatile solvent to the carrier gas in response to the signal to produce a desired concentration of volatile solvent in the control gas passing through the chamber.

The volatile solvent can be added to the carrier gas by mixing together a first gas stream of solvent-free carrier gas and a second gas stream containing solvent vapor at a controlled concentration, the first and second gas streams being mixed in the proportion required to yield a carrier gas having a controlled concentration of solvent vapor therein. A controlled amount of solvent can be atomized in the carrier gas to yield a carrier gas having a controlled concentration of solvent vapor therein.

The solvent vapor concentration sensor positioned in the carrier gas passing through the chamber can include a sensor component positioned for exposure to solvent vapor which has a property which changes as a function of the solvent vapor concentration to which it is exposed. The sensor can be any sensor capable of providing this function. Preferred sensors include an acoustic sensor which changes resonant frequency with solvent concentration and produces a signal proportional to solvent concentration.

The sensor can include a membrane, the vibrational frequency of which changes as a function of the solvent vapor concentration to which it is exposed; it can include a surface, the electrical properties of which change as a function of the solvent vapor concentration to which it is exposed; or it can detect an acoustical property which is a function of the solvent vapor concentration. The sensor can include an optical detector optically exposed to the solvent vapor, the optical detector sensing an optical property of the solvent which is a function of the solvent vapor concentration. The optical detector can include a spectrophotometer which measures a spectral property of the solvent vapor, such as polarization shift properties, which changes as a function of the solvent vapor concentration.

DETAILED DESCRIPTION OF THE INVENTION

Figure 1:
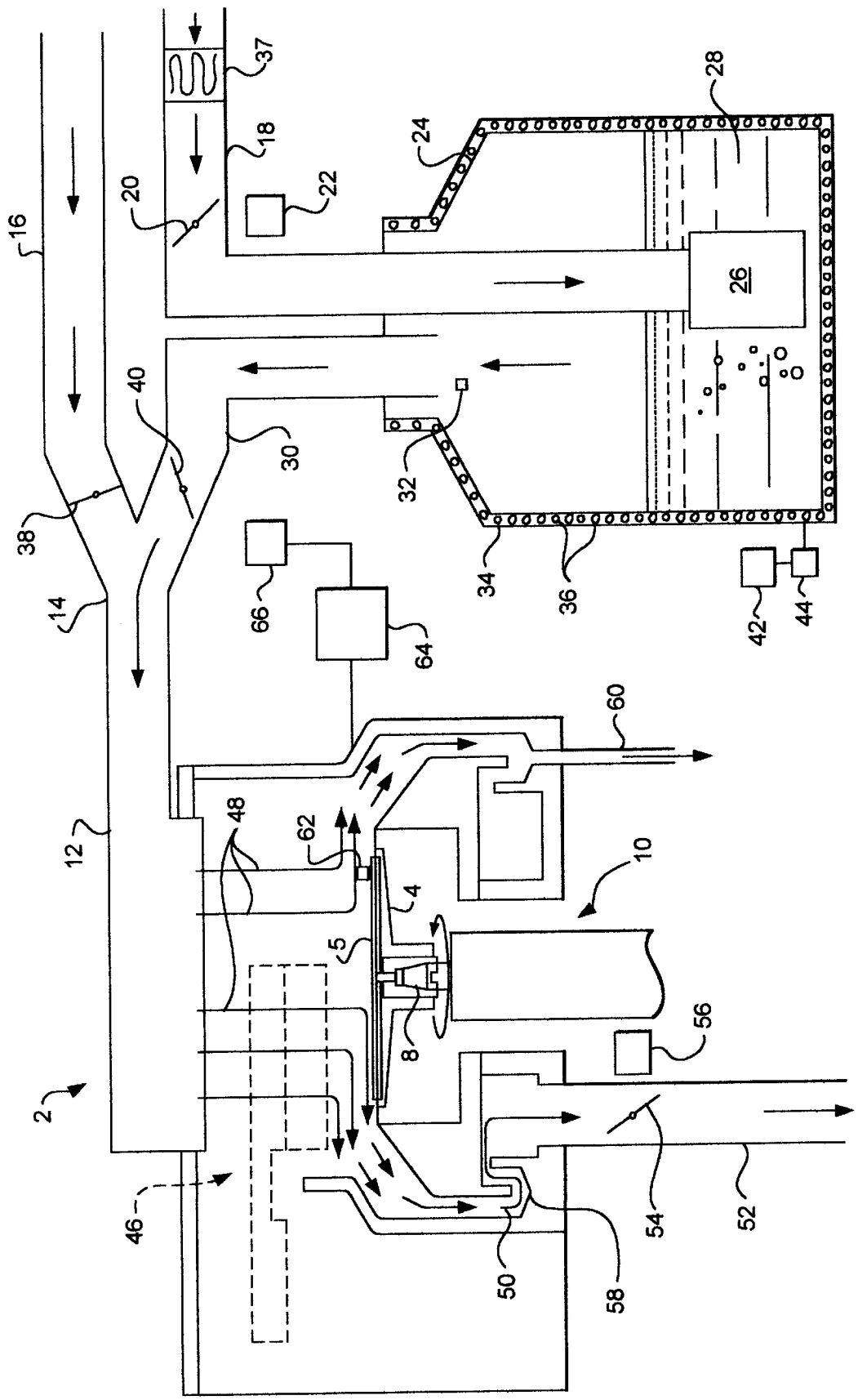
FIG. 1 is a schematic view of a spin coating apparatus and a solvent vapor feedback control system associated therewith.

The dynamics of viscosity control are affected by the volatile exchange between the photoresist layer and the surrounding atmosphere during the spin-coating process, that is, solvent molecules in the film continue to leave and solvent molecules in the atmosphere are continuously absorbed by the film. Furthermore, some commercial photoresists may contain more than one solvent species, each with its own different vapor pressure profile.

Because of the changing viscosities and surface tensions of solvent-exchanged photoresist film, good planarization requires rapidly adjustable, accurate and reproducible time-profiled solvent-mediated environmental composition control as the polymer film spreads over the wafer surface. Coating thickness control across the wafer and from wafer-to-wafer is measured in angstroms. This process is dynamic, not steady-state. Adjustments and control responses in solvent vapor composition are required in fractions of a second to establish and reproduce the solvent vapor concentration/time profile required for the precision coatings demanded by the next generation of semiconductor devices. This requirement cannot be satisfied using a simple, solvent-saturated atmosphere system or systems designed to provide a simple, constant atmospheric solvent concentration.

The precise solvent concentration in the vapor and respective vapor pressures are under constant control during the spin-coating process by employing a combination of features, all of which contribute to the control. Copending, commonly assigned U.S. application Ser. No. 08/566,227, filed Dec. 1, 1995, describes an apparatus having the ability to introduce a mixture of gas streams, one a solvent-bearing stream and the other a solvent-free stream, to provide adjustment of the solvent vapor in the atmosphere above the substrate. It provides a system for introducing a precise solvent vapor profile during the coating operation based on a predictive model which anticipates the desired solvent vapor level required. It does not take into account, however, the precise contribution of variable solvent evaporation from the coating to the solvent vapor mixture immediately above the wafer.

The present invention combines with the gas stream mixture a sensor and feedback system to measure the solvent vapor concentration over the wafer surface and to provide adjustment to the incoming solvent vapor concentration to achieve the desired solvent vapor concentration, the feedback circuit controlling the ratio of solvent-saturated gas and solvent-free gas to provide to the wafer surface the precise solvent vapor concentration required by the predictive model. This gives a far higher level of precision to the control of the solvent vapor at the wafer surface.

This control can be reproduced wafer-to-wafer to yield a superior, highly reproducible result which has not been achieved prior to this invention. The dynamic ability to constantly and rapidly change the solvent vapor concentration by this technique is a critical aspect of the invention and is not present in the processes of the prior art of record.

FIG. 1 is a schematic view of a spin coating apparatus and a solvent vapor feedback control system associated therewith. The apparatus 2 includes a rotatable support chuck 4 mounted in a spin coating housing 6 and supporting a wafer 5. The chuck 4 is mounted on an axle 8 which passes through an opening 10 in the housing 6. The housing 6 includes solvent vapor and carrier gas supply manifold and dispenser 12. Dispenser 12 introduces a control gas comprising a mixture of a non-solvent gas and a certain concentration of solvent to be passed into the housing 6 above the wafer 5.

Gases are fed into the manifold 12 from gas and solvent supply conduit 14 communicating therewith. A solvent-free gas which is dry, such as air or nitrogen gas, is fed by solvent-free gas conduit 16.

A carrier gas supply conduit 18 with flow control valve 20 communicates with bubbler 26 immersed in a volume of solvent 28 in bubbler chamber 24. A solvent vapor saturated gas stream is prepared by passing gas from gas supply conduit 18 through inlet control valve 20 with valve controller 22 to bubbler chamber 24 with bubbler 26, from which the gases pass upward through solvent 28, emerging as solvent-saturated gas at the temperature set for the solvent. The bubbler 26 in this embodiment can be a porous glass frit from which the gas is passed through the liquid solvent 28. Outlet conduit 30 communicates with the bubbler chamber 24 for receipt of solvent-saturated gas. The gases, saturated with solvent vapor, are removed from chamber 24 through conduit 30. Chamber 24 has a solvent vapor sensor 32 which generates a signal corresponding to the solvent concentration in the vapor. Bubbler chamber 24 is surrounded by a temperature control jacket 34 which contains heating/cooling coils 36 or similar conventional means for maintaining or changing the temperature of the solvent 28 at or to a set point. The gas supply conduit 18 has an optional heater or heat exchanger 37 which controls the temperature of the incoming gas to a set temperature.

The flows of solvent-free gas stream from conduit 16 and solvent-saturated gas from conduit 30 are controlled by the solvent-free gas stream control valve 38 and solvent-saturated gas control valve 40. Valves 38 and 40 can be any standard, conventional remote control valve, such as mass flow controllers, for example.

By respective control of the position of the valves 38 and 40, the respective passageways 16 and 30 can independently be varied from a totally closed position (such as shown for valve 38) to a completely open position (such as shown for valve 40). In this manner, the gas stream fed to manifold 12 can vary from a stream which is completely free from solvent supplied from conduit 16 with valve 38 open and valve 40 closed, to a stream which is saturated with solvent vapor supplied from conduit 30 with valve 38 closed and valve 40 open. Or, the valves 38 and 40 can be opened to any combination of positions to provide a full range of solvent vapor concentrations from 0 percent solvent to fully saturated solvent vapor in the carrier gas stream.

The temperature of the solvent-bearing gas supplied by the bubbler 26 is maintained or controlled to a set point by heating/cooling coils 36 which control the temperature of the solution 28. Alternatively or concurrently, the temperature of the incoming gas supplied by conduit 18 can be raised or lowered or controlled by a heater or heat exchanger 37. Heat must be supplied to the solvent 28 to compensate for heat loss due to evaporation.

Sensor 32, sensor signal processing and control output generator 42, and temperature controller 44 are connected as described hereinafter with regard to FIG. 2. Sensor 32 sends signals to a sensor signal processing and control output generator 42 which, in turn, sends control signals to the temperature controller 44 for controlling the energy or liquid supplied to the heating/cooling coils 36 to change or maintain the temperature of the vessel 24 and the liquid contents 28 to a set temperature point.

The apparatus includes a dispensing head 46 for applying a solution of photoresist pre-polymer to the upper surface of wafer 5. The conventional dispensing head 46 can supply a stream of photoresist solution to the center of the wafer 5 or along a surface from the center to the edge, the rotation of the chuck 4 and the wafer 5 spreading the photoresist over the entire wafer surface by centrifugal action, and spinning off the outer edge any excess photoresist solution.

The gas stream 48 containing the solvent vapor passes in a stream downward and across the upper surface of wafer 5 to control the atmosphere above the wafer surface and thereby control the rate of solvent evaporation from the photoresist coating. The gas flow is quickly drawn over the edge of the wafer, into annular channel 50 and to the exhaust conduit 52 with conventional exhaust valve 54. The exhaust control valve 54 is connected to a valve controller which is connected to the sensor signal processing and control output generator 64, connected thereto as described with respect to FIG. 2. The bottom of the annular channel 50 defines an annular drain channel 58 leading to the photoresist drain conduit 60.

One or more solvent concentration sensors 62 are positioned to determine the solvent concentration in the coating chamber. A preferred sensor position is just above the surface of wafer 5, as shown, but sensors 62 can be optionally positioned in the gas stream 48 leading to and leaving the wafer surface. The sensors 62 are connected to a controller 64, as described in FIG. 2. The controller 64 is connected to valve mass flow controller (MFC) 66 which connects to valves 38 and 40, the connections being shown in greater detail in FIG. 2.

In a typical process, the semiconductor wafer 5 is secured to the chuck 4 using any standard method, such as a vacuum established between the chuck 4 and the wafer 5. A wafer transport door (not shown) to the housing 6 is thereafter closed. The housing 6 is purged with dry solvent-free gas from conduit 16 to purge the chamber. Control gas having a predetermined concentration of solvent vapor is formed by adjustment of valves 38 and 40 to establish the proper ratio of gases from conduits 16 and 30. If complete solvent saturation is desired, for example, valve 38 might be closed and valve 40 opened to introduce a stream of solvent-saturated gas from the conduit 30.

The solvent concentration of the control gas is measured by sensor 62, and adjustments are made to the valves 38 and 40 as required to change or maintain a set level of solvent in the incoming gas stream 48 in a continuous feedback system using the sensor signal processing and control output generator 64 and the mass flow controller 66.

The level of solvent in the carrier gas is adjusted by raising or lowering the temperature of the solvent 28, and optionally, the incoming gas stream from conduit 18 to a temperature level which yields the desired percentage of solvent at full saturation at that temperature. The solvent concentration is measured by sensor 32, and the signal therefrom is used to adjust the temperature of the solution 28, and/or incoming gas from conduit 18, by operation of the sensor signal processing and control output generator 42, temperature controller 44 and carrier gas supply valve controller 22 connected thereto.

In order to deposit a layer of photoresist onto the wafer 5, the polymer solution is applied across the surface of the wafer 5 via the dispensing head 46. This is achieved by dispensing the polymer solution in a continuous stream from a nozzle or similar dispenser (not shown) onto the wafer surface while the wafer 5 is spinning at relatively low speed. In the preferred embodiment, the nozzle is moved substantially radially across the wafer 5. Alternatively, the solution can be dispensed at the center of the substrate, or multiple nozzles can be used. By adjusting the spin speed of the wafer 5, the movement of the nozzle, and the rate at which the polymer solution is dispensed, a suitable distribution of the solution can be achieved. Alternatively, the polymer solution is deposited onto the wafer by means of a film extruder.

The solvent vapor sensors 32 and 62 can be any sensor which is capable of generating a signal having a functional relationship to the percentage of solvent in a carrier gas. One type of suitable chemical vapor sensor is the resonance sensing microelectromechanical system with a solvent absorbent membrane or plate, the resonance frequency of the membrane being a function of the solvent vapor concentration in the vapor. An example of this type of sensor is the Model BMC200 from Berkeley MicroInstruments, Inc. (Richmond, Calif.). The electronic unit powers the sensor and transmits sensor data to the central controller. Another example of a sensor suitable for use in the present invention is the membrane system described in U.S. Pat. No. 5,485,750, the entire contents of which are hereby incorporated by reference.

Other vapor concentration sensors measure the solvent concentration by sensing or measuring electrical (e.g., conductivity, impedance (resistance, capacitance), electrochemical, photoconductivity), optical (e.g., absorption, polarization shift), sound (acoustical) and ultrasonic properties of the gas containing the solvent vapor using conventional, well-known devices for these measurements. Sensors using changes in electrical properties in response to exposure of materials to the solvent vapor are described in U.S. Pat. Nos. 3,579,097; 3,999,122; 4,495,793; 4,572,900; 4,584,867; 4,636,767; 4,638,286; 4,812,221; 4,864,462; 4,874,500; 4,887,455; 4,900,405; 4,926,156; 5,200,633; 5,298,738; 5,372,785; 5,394,735; 5,417,100; and 5,448,906, for example. Optical measurement devices responsive to solvent vapor concentrations are described in U.S. Pat. Nos. 3,796,887; 3,995,960; 4,661,320; 4,836,012; 4,875,357; 4,934,816; 5,030,009; 5,055,688; 5,173,749; 5,381,010; and 5,436,167, for example. Acoustic wave and ultrasonic devices responsive to solvent vapor concentrations are described in U.S. Pat. Nos. 4,312,228; 4,895,017; 4,932,255; 5,189,914; 5,221,871; 5,235,235; 5,343,760; 5,571,944; and 5,627,323, for example. The entire contents of the above-listed patents are hereby incorporated by reference.

Figure 2:
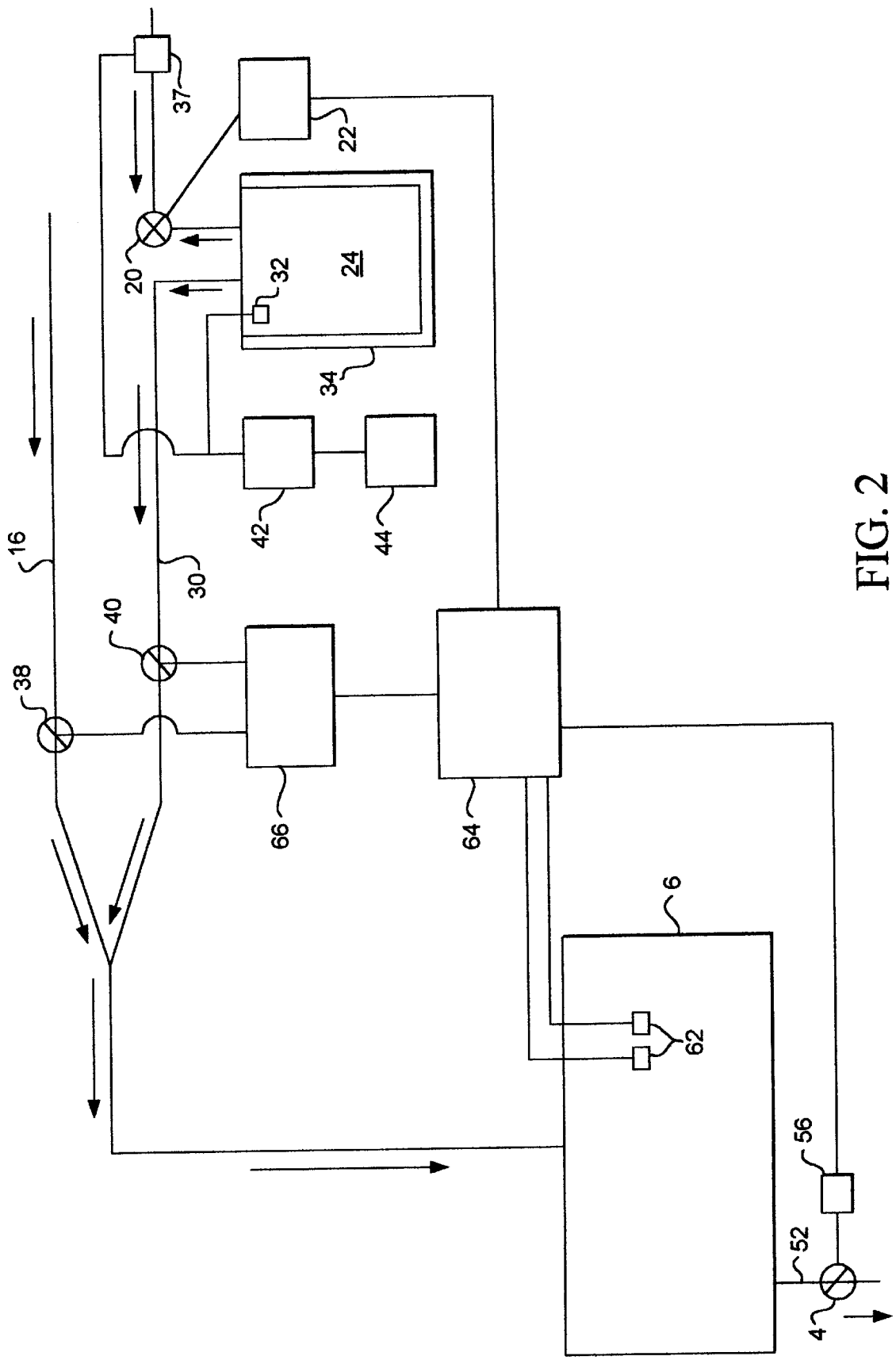
FIG. 2 is a schematic drawing of the solvent vapor concentration control system of this invention.

FIG. 2 is a schematic drawing of the solvent vapor concentration control system of this invention. The sensor signal processing and control output generator 64 is the hub of the solvent delivery control system. The generator 64 has an input, which is connected to the sensors 62 for receipt of information about the solvent vapor concentration in the coating chamber, and outputs connected to valve controllers 22, 56 and 66 for control of valve 20, which controls the flow of carrier gas to the solvent saturator 24 (controller 22); control of valves 38 and 40, which produce the mix of streams of solvent-free carrier gas and carrier gas (controller 66); and control of the exhaust valve 54 (controller 56), which controls the flow of gases exhausted from the coating assembly.

The hub of the solvent saturator controls is the sensor signal processing and control output generator 42, having an input which is connected to sensor 42 for receipt of signals denoting the solvent concentration in the vapor above the liquid in the tank, and outputs to temperature controller 44 for the heating/cooling coils controlling the temperature of solvent vessel 24 and heat exchanger 37.

Figure 3:
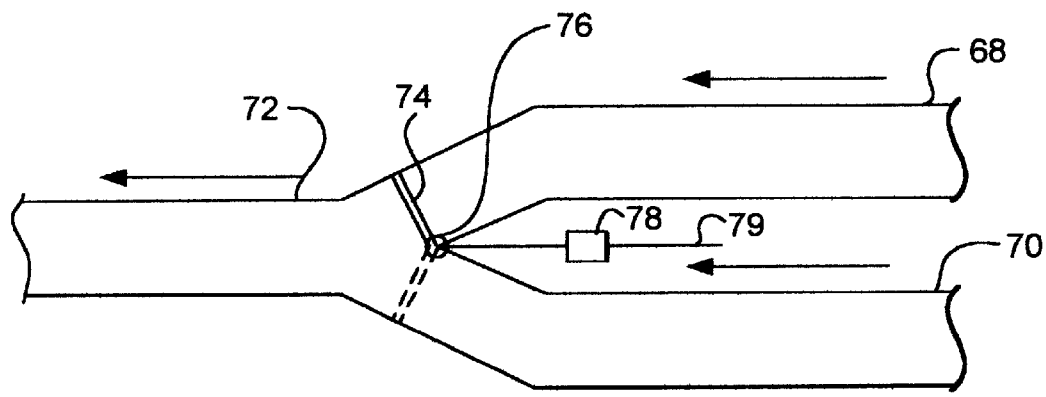
FIG. 3 is a schematic drawing of an alternative gas flow control valve assembly.

FIG. 3 is a schematic drawing of an alternative gas flow control valve assembly. In this alternative configuration, the solvent-free carrier gas supply conduit 68 and the solvent vapor-saturated gas conduit 70 merge to form a single solvent vapor-containing gas supply conduit 72 which communicates with a manifold and dispenser, such as the manifold and dispenser 12 shown in FIG. 1. A pivotal valve 74 pivots on hinge 76, located at the junction of conduits 68 and 70, to rotate about its hinge 76 from a position closing the conduit 68 to a position closing the conduit 70 (shown by dotted line), or to intermediate positions therebetween to partially close one or the other of gas supply conduits 68 and 70. The position of valve 74 determines the proportion of the solvent-bearing gas supplied to the gas distributor. Valve controller 78 connects to a step motor or other conventional control system for positioning valve 74. Valve controller 78 is connected by line 79 to the central sensor signal processing and control output generator, such as the generator 64 shown in FIG. 1.

Figure 4:
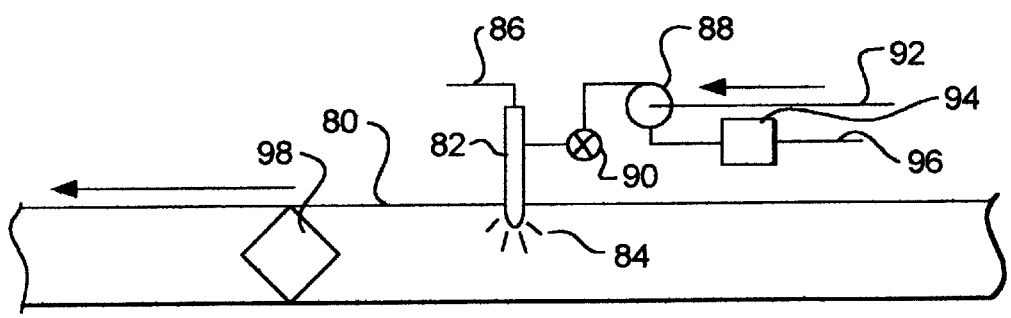
FIG. 4 is a schematic drawing of an atomizer spray solvent system for providing a controlled solvent vapor concentration in carrier gas flowing to the coating chamber.

FIG. 4 is a schematic drawing of an atomizer spray solvent system for providing a controlled solvent vapor concentration in carrier gas flowing to the coating chamber. In this embodiment, only one carrier gas supply conduit 80 communicating with a distributor, such as the distributor 12 shown in FIG. 1, is needed. Atomizer injector 82, which is mounted in the wall of conduit 80, has an outlet communicating with the interior of conduit 80 to introduce a controlled amount or volume of atomized spray of solvent 84 into the carrier gas flowing through the conduit 80. The atomizer 82 is connected by pressurized gas supply conduit 86 with a supply of gas under pressure, which can be a carrier gas for operation of the aspirator. The injector 82 is supplied with liquid solvent by solvent pump 88, connected thereto through adjustable needle valve 90, the pump communicating with a solvent reservoir through solvent supply conduit 92. The pump and injector can be any conventional atomizer and high accuracy flow-controlled pump which are capable of effectively delivering an accurate, controlled flow of solvent into the carrier gas stream. Pump controller 94 is connected to the pump 88 and, by line 96, with the sensor signal processing and control output generator, such as generator 64 shown in FIG. 1. The atomizer 82 is controlled by an output generator to provide a controlled volume of solvent into the carrier gas stream in response to the solvent vapor concentration sensed in the coating chamber, as described above, the principal difference with the embodiments described hereinabove being in the system used to create the solvent and carrier gas mixture. Optional turbulence mixer 98 in conduit 80 disperses the solvent vapors throughout the carrier gas flowing therethrough.

This invention provides an adaptive control of solvent concentration with the process chamber used for spin coating of polymers such as photoresist in the area of photolithography. The invention provides an improved mean thickness and uniformity control for polymer film processes employed during the manufacture of small feature size advanced devices.

The vapor pressures of most organic solvents are strongly dependent upon solvent type and temperature. Temperature sensitivities for vapor pressures of ethyl lactate, propylene glycol monomethyletheracetate (PGMEA), and acetone are 0.17 Torr/°C., 0.16 Torr/°C., and 9.4 Torr/°C., respectively. As a result, in order to control the concentration of solvent introduced into a process chamber, one needs to control solvent temperature accurately. In addition, the solvent concentration delivered to a chamber is dependent on the amount of head room space above the liquid level within the solvent canister. All of these factors limit the control of the solvent concentration within the process chamber, causing serious problems with the production of repeatable film thickness profiles during spin coating.

This invention uses one or more solvent vapor sensors to measure solvent concentration. The output of the sensors is used to control mass flow controllers in real time by way of an algorithm. Sensors are placed in the process chamber, solvent canister, and/or optionally, in any pathway therebetween. Any fluctuation in solvent temperature or headroom space which may cause variation of the solvent concentration inside the process chamber can be compensated by mass flow controllers in a closed loop fashion to ensure constant and repeatable solvent atmospheres for every wafer processed. Decision-making is done by a process control algorithm which uses known chemical properties of the solvent, required process conditions and numerical models.

This invention can reduce dependence on precise temperature controls for the solvent to achieve the desired solvent concentration in the coating chamber. The invention can be applied to different systems for introducing the solvent vapor, such as the bubbler system disclosed or a liquid mass flow controller combined with an atomizer, which is also considered to be within the scope of this invention. This invention makes solvent concentration control within a process chamber totally transparent to the user.

It will be readily apparent to those skilled in the art that this invention is not limited to the embodiments described above. Different configurations and embodiments can be developed without departing from the scope of the invention and are intended to be included within the scope of the claims.

The invention claimed is:

1. An apparatus for spin coating surfaces with liquid polymer comprising
   a spin coating chamber having a rotatable chuck for supporting an object to be coated,
   a distributor communicating with the coating chamber and positioned to introduce gases into the chamber,
   a solvent vapor and carrier gas supply means for supplying a carrier gas having a controlled level of solvent vapor therein within the range of from 0 to saturation concentrations of solvent vapor,
   a solvent vapor sensor positioned with respect to the coating chamber to produce signals which are a function of the concentration of solvent vapor in the coating chamber, and
   control means connected to the solvent vapor concentration sensor and to said solvent vapor and carrier gas supply means for controlling the level of solvent vapor in the carrier gas supplied by the solvent vapor and carrier gas supply means.

2. An apparatus for spin coating surfaces with liquid polymer of claim 1 including a coating zone adjacent the rotatable chuck corresponding to the surface to be coated and wherein the solvent vapor sensor is positioned between the distributor and the coating zone.

3. An apparatus for spin coating surfaces with liquid polymer of claim 1 wherein the solvent vapor and carrier gas supply means comprises
   a solvent vapor supply conduit communicating with said distributor,
   a carrier gas supply conduit communicating with said distributor, and
   control valve means positioned with respect to said solvent vapor supply conduit and said carrier gas supply conduit for controlling the proportion of gases from said conduits which are supplied to the distributor.

4. An apparatus for spin coating surfaces with liquid polymer of claim 3 including a gas supply manifold communicating with said distributor and with the solvent vapor supply conduit and the carrier gas supply conduit, and wherein the control valve means is positioned with respect to said manifold and said solvent vapor supply conduit and said carrier gas supply conduit for controlling the proportion of gases from said conduits which are supplied to the distributor.

5. An apparatus for spin coating surfaces with liquid polymer of claim 4 wherein the manifold has an inlet and the solvent vapor supply conduit and the carrier gas supply conduit have outlets, and wherein the control valve means is a valve positioned to simultaneously control flow from each of said outlets.

6. An apparatus for spin coating surfaces with liquid polymer of claim 4 wherein the solvent vapor supply conduit and the carrier gas supply conduit each have control valves which are each positioned to control flow from said conduits to the distributor.

7. An apparatus for spin coating surfaces with liquid polymer of claim 1 wherein the solvent vapor and carrier gas supply means includes a distributor manifold, a carrier gas supply conduit communicating with said manifold, and a solvent atomizer with a solvent atomizer pump communicating with said manifold, the control means being connected to the solvent vapor concentration sensor and to said solvent atomizer pump to control the amount of solvent to be atomized by said atomizer into the manifold.

8. An apparatus for spin coating surfaces with liquid polymer of claim 1 wherein the solvent vapor and carrier gas supply means includes a carrier gas supply conduit communicating with said distributor and a solvent atomizer with a solvent atomizer pump communicating with said carrier gas conduit, the control means being connected to the solvent vapor concentration sensor and to said solvent atomizer pump for controlling the amount of solvent to be atomized by said atomizer into the carrier gas supply conduit.

9. An apparatus for spin coating surfaces with liquid polymer of claim 1 wherein the solvent vapor concentration sensor includes a component positioned for exposure to solvent vapor and which has a property which changes as a function of the solvent vapor concentration to which said component is exposed.

10. An apparatus for spin coating surfaces with liquid polymer of claim 9 wherein the sensor includes a membrane, the vibrational frequency of which changes as a function of the solvent vapor concentration to which the membrane is exposed.

11. An apparatus for spin coating surfaces with liquid polymer of claim 9 wherein the sensor includes a surface, the electrical properties of which change as a function of the solvent vapor concentration to which the surface is exposed.

12. An apparatus for spin coating surfaces with liquid polymer of claim 9 wherein the sensor detects an acoustical property which is a function of the solvent vapor concentration.

13. An apparatus for spin coating surfaces with liquid polymer of claim 9 wherein the sensor includes an optical detector optically exposed to the solvent vapor, the optical detector sensing an optical property of the solvent which is a function of the solvent vapor concentration.

14. An apparatus for spin coating surfaces with liquid polymer of claim 13 wherein the optical detector includes a spectrophotometer which measures a spectral property of the solvent vapor which changes as a function of the solvent vapor concentration.

15. An apparatus for spin coating surfaces with liquid polymer of claim 13 wherein the optical detector measures polarization shift properties which are a function of the solvent vapor concentration.

16. A method for spin coating a surface with a polymer in a volatile solvent, the coating being applied in a stream of carrier gas having a controlled concentration of volatile solvent therein, comprising applying said polymer to a surface to be coated in a coating chamber, passing a carrier gas through the coating chamber, the carrier gas having a concentration of volatile solvent for the liquid polymer therein, generating with a solvent vapor concentration sensor positioned in the carrier gas passing through the chamber, a signal which is a function of the concentration of volatile solvent in the carrier gas, and adding an amount of volatile solvent to the carrier gas in response to the signal to produce a desired concentration of volatile solvent in the control gas passing through the chamber.

17. A method for spin coating a surface with a polymer in a volatile solvent of claim 16 wherein the volatile solvent is added to the carrier gas by mixing together a first gas stream of solvent-free carrier gas and a second gas stream containing solvent vapor at a controlled concentration, the first and second gas streams being mixed in the proportion required to yield a carrier gas having a controlled concentration of solvent vapor therein.

18. A method for spin coating a surface with a polymer in a volatile solvent of claim 16 wherein a controlled amount of solvent is atomized in the carrier gas to yield a carrier gas having a controlled concentration of solvent vapor therein.

19. A method for spin coating a surface with a polymer in a volatile solvent of claim 16 wherein the solvent vapor concentration sensor positioned in the carrier gas passing through the chamber includes a sensor component positioned for exposure to the solvent vapor, wherein the sensor component has a property which changes as function of the solvent vapor concentration to which said sensor component is exposed.

20. A method for spin coating a surface with a polymer in a volatile solvent of claim 19 wherein the sensor includes a membrane, the vibrational frequency of which changes as a function of the solvent vapor concentration to which said membrane is exposed.

21. A method for spin coating a surface with a polymer in a volatile solvent of claim 19 wherein the sensor includes a surface, the electrical properties of which change as a function of the solvent vapor concentration to which said surface is exposed.

22. A method for spin coating a surface with a polymer in a volatile solvent of claim 19 wherein the sensor detects an acoustical property which is a function of the solvent vapor concentration.

23. A method for spin coating a surface with a polymer in a volatile solvent of claim 19 wherein the sensor includes an optical detector optically exposed to the solvent vapor, the optical detector sensing an optical property of the solvent which is a function of the solvent vapor concentration.

24. A method for spin coating a surface with a polymer in a volatile solvent of claim 23 wherein the optical detector includes a spectrophotometer which measures a spectral property of the solvent vapor which changes as a function of the solvent vapor concentration.

25. A method for spin coating a surface with a polymer in a volatile solvent of claim 23 wherein the optical detector measures polarization shift properties which are a function of the solvent vapor concentration.

* * * * *